US010431767B2

(12) United States Patent
Woo

(10) Patent No.: US 10,431,767 B2
(45) Date of Patent: Oct. 1, 2019

(54) ORGANIC LIGHT EMITTING DISPLAY DEVICE AND METHOD OF MANUFACTURING THE SAME

(71) Applicant: LG DISPLAY CO., LTD., Seoul (KR)

(72) Inventor: JoungWon Woo, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/835,059

(22) Filed: Dec. 7, 2017

(65) Prior Publication Data
US 2018/0166649 A1 Jun. 14, 2018

(30) Foreign Application Priority Data

Dec. 9, 2016 (KR) ........................ 10-2016-0167533

(51) Int. Cl.
H01L 21/00 (2006.01)
H01L 29/06 (2006.01)
H01L 51/52 (2006.01)
H01L 51/50 (2006.01)
H01L 51/56 (2006.01)
H01L 27/32 (2006.01)

(52) U.S. Cl.
CPC ...... *H01L 51/5212* (2013.01); *H01L 27/3246* (2013.01); *H01L 51/504* (2013.01); *H01L 51/52* (2013.01); *H01L 51/5215* (2013.01); *H01L 51/5221* (2013.01); *H01L 51/56* (2013.01); *H01L 51/5056* (2013.01); *H01L 51/5072* (2013.01); *H01L 2251/558* (2013.01)

(58) Field of Classification Search
CPC .................................................. H01L 27/3246
USPC ...................... 438/31, 140; 257/98, 127, 484
See application file for complete search history.

(56) References Cited

U.S. PATENT DOCUMENTS 9,570,471 B2 * 2/2017 Heo ..................... H01L 27/3246
9,947,733 B2 * 4/2018 Jang ..................... H01L 27/3246
2011/0215330 A1 9/2011 Shin et al.
2013/0049028 A1 2/2013 Kim et al.
2013/0119389 A1 5/2013 Yamazaki et al.
2013/0256638 A1 10/2013 Uesugi et al.

* cited by examiner

Primary Examiner — Calvin Lee
(74) Attorney, Agent, or Firm — Birch, Stewart, Kolasch & Birch, LLP

(57) ABSTRACT

An organic light emitting display device can include an anode electrode disposed on a substrate; an auxiliary electrode disposed on the anode electrode, the auxiliary electrode having a first height and a second height being different from the first height; a bank disposed on one side of the auxiliary electrode and another side of the auxiliary electrode; an organic light emitting layer disposed on an upper surface of the auxiliary electrode in an opening area exposed by the bank; and a cathode electrode disposed on the organic light emitting layer, in which the auxiliary electrode has the first height in a covered area overlapping with the bank and the second height in the opening area exposed by the bank.

20 Claims, 8 Drawing Sheets

ORGANIC LIGHT EMITTING DISPLAY DEVICE AND METHOD OF MANUFACTURING THE SAME

CROSS-REFERENCE TO RELATED APPLICATIONS

This application claims the benefit of the Korean Patent Application No. 10-2016-0167533 filed in the Republic of Korea on Dec. 9, 2016, which is hereby incorporated by reference as if fully set forth herein.

BACKGROUND

Field of the Invention

The present disclosure relates to a display device, and more particularly, to an organic light emitting display device and a method of manufacturing the same.

Discussion of the Related Art

Examples of flat panel display (FPD) devices include liquid crystal display (LCD) devices, plasma display panels (PDPs), electrophoretic display (EPD) devices, organic light emitting display devices, etc. Recently, organic light emitting display devices are being widely used as one type of FPD device.

In such display devices, the organic light emitting display devices are self-emitting devices and have low power consumption, a fast response time, high emission efficiency, high luminance, and a wide viewing angle, thereby attracting attention as next-generation display devices.

Particularly, organic light emitting display devices each including an organic light emitting layer formed of a material having a soluble characteristic is being recently developed for increasing the convenience and efficiency of a process of manufacturing the organic light emitting display devices.

FIG. 1 is a schematic cross-sectional view of a related art soluble organic light emitting display device.

As shown in FIG. 1, a planarization layer 1, an anode electrode 2, a bank 3, an organic light emitting layer 5, and a cathode electrode 6 are sequentially provided on a substrate.

The planarization layer 1 planarizes a thin film transistor (TFT) layer provided on the substrate, and the anode electrode 2 is provided on the planarization layer 1.

The bank 3 is provided on the anode electrode 2 and defines a pixel area. The bank 3 is provided on each of one side and the other side of the anode electrode 2 to expose an upper surface of the anode electrode 2. The bank 3 is formed of an organic material.

The organic light emitting layer 5 is provided in the pixel area defined by the bank 3, and the cathode electrode 6 is provided on the organic light emitting layer 5.

In detail, in the soluble organic light emitting display device, in order to increase the convenience and efficiency of a manufacturing process, an organic light emitting material having a soluble characteristic is sprayed or dropped on the pixel area defined by the bank 3 through an inkjet printing process, and then, by curing the organic light emitting material, the organic light emitting layer 5 is formed.

Particularly, in order for the organic light emitting material not to flow out into an adjacent pixel area, an upper surface of the bank 3 is formed to have a hydrophobic characteristic. That is, in the soluble organic light emitting display device, the bank 3 restricts an area where the organic light emitting layer 5 is provided, so that the organic light emitting material is well collected in only a corresponding pixel area.

The related art soluble organic light emitting display device has the following problems.

As described above, after the bank 3 including an organic material is formed, the organic light emitting layer 5 and the cathode electrode 6 are formed on the anode electrode 2. However, as illustrated in FIG. 1, a residual layer including an organic material or a foreign material D remains on the anode electrode 2 in a process of forming the bank 3. Also, the residual layer including the organic material or the foreign material D obstructs a movement of a hole from the anode electrode 2, causing the reduction in lifetime of the organic light emitting display device and the degradation in performance.

In order to solve such a problem, in the related art organic light emitting display device, surface treatment technology using plasma or extreme ultraviolet (EUV) is used for removing the residual layer including the organic material or the foreign material D after the bank 3 is formed. However, a hydrophobic area of the upper surface of the bank 3 is simultaneously removed by the surface treatment technology. For this reason, the upper surface of the bank 3 does not have a hydrophobic characteristic, and consequently, a unique function of the bank 3 for restricting the area where the organic light emitting layer 5 is provided is not realized.

Moreover, since the residual layer including the organic material or the foreign material D remains on the upper surface of the anode electrode 2, the upper surface of the anode electrode 2 has a rough surface, and for this reason, the organic light emitting layer 5 and the cathode electrode 6 formed on the upper surface of the anode electrode 2 are not formed to have a uniform thickness, causing the reduction in emission efficiency.

SUMMARY

Accordingly, the present disclosure is directed to provide an organic light emitting display device and a method of manufacturing the same that substantially obviates one or more problems due to limitations and disadvantages of the related art.

An aspect of the present disclosure is directed to provide an organic light emitting display device and a method of manufacturing the same, in which a clean electrode surface, from which a foreign material or a residual layer including an organic material which remains in a process of forming an organic bank is removed, is secured.

Another aspect of the present disclosure is directed to provide an organic light emitting display device and a method of manufacturing the same, in which an auxiliary electrode for removing a foreign material or a residual layer including an organic material is additionally provided to prevent a hydrophobic area of an upper surface of an organic bank from being damaged, and thus, an organic light emitting layer is provided in only a corresponding pixel area.

Another aspect of the present disclosure is directed to provide an organic light emitting display device and a method of manufacturing the same, in which an auxiliary electrode having a refractive index relatively greater than that of an organic light emitting layer is provided on an anode electrode, thereby enhancing light efficiency.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device including an anode electrode on a substrate, an auxiliary electrode on the anode electrode, a bank on each of one side and another side of the auxiliary electrode, an organic light emitting layer on an upper surface of the auxiliary electrode exposed by the bank, and a cathode electrode on the organic light emitting layer, in which the auxiliary electrode is provided to have different heights in an area covered by the bank and an opening area exposed by the bank.

In another aspect of the present disclosure, there is provided a method of manufacturing an organic light emitting display device including forming an anode electrode and an auxiliary electrode on a substrate, forming a bank on each of one side and another side of the auxiliary electrode, the bank including an organic material, etching a portion of the auxiliary electrode by using the bank as a mask so that the auxiliary electrode has different heights in an area covered by the bank and an opening area exposed by the bank, forming an organic light emitting layer on an upper surface of the auxiliary electrode exposed by the bank, and forming a cathode electrode on the organic light emitting layer.

It is to be understood that both the foregoing general description and the following detailed description of the present disclosure are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Figure 1:
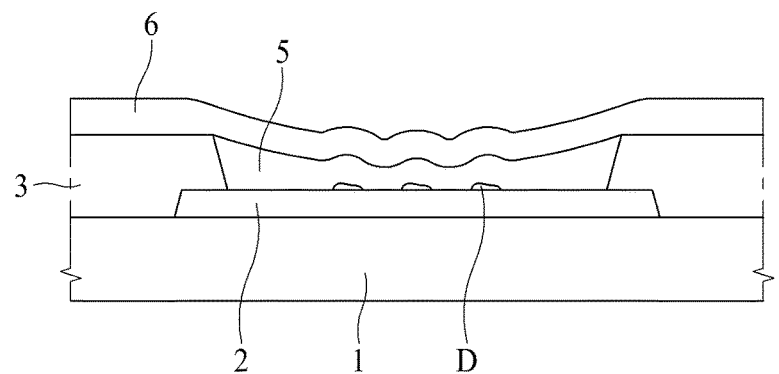
FIG. 1 is a schematic cross-sectional view of a related art soluble organic light emitting display device.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of the claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a situation where "comprise," "have," and "include" described in the present specification are used, another part may be added unless "only" is used. The terms of a singular form may include plural forms unless referred to the contrary.

In construing an element, the element is construed as including an error range although there is no explicit description.

In describing a position relationship, for example, when a position relation between two parts is described as "on," "over," "under" and "next," one or more other parts may be disposed between the two parts unless 'just' or 'direct' is used.

In describing a time relationship, for example, when the temporal order is described as "after," "subsequent," "next," and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
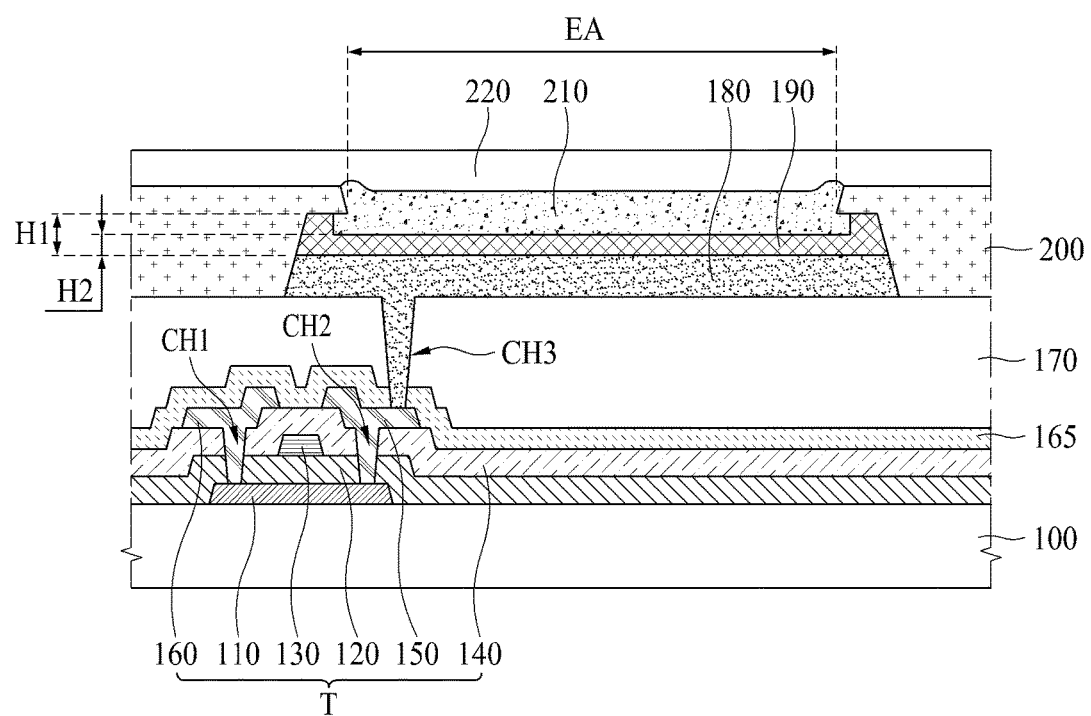
FIG. 2 is a cross-sectional view of an organic light emitting display device according to an embodiment of the present disclosure.

FIG. 2 is a cross-sectional view of an organic light emitting display device according to a first embodiment of the present disclosure.

As illustrated in FIG. 2, the organic light emitting display device according to the first embodiment of the present disclosure can include a thin film transistor (TFT) layer T, a passivation layer 165, a planarization layer 170, an anode electrode 180, an auxiliary electrode 190, a bank 200, an organic light emitting layer 210, and a cathode electrode 220 which are formed on a substrate 100.

The TFT layer T can include an active layer 110, a gate insulation layer 120, a gate electrode 130, an interlayer dielectric 140, a source electrode 150, and a drain electrode 160.

The active layer 110 may be formed on the substrate 100 to overlap the gate electrode 130. The active layer 110 may be formed of a silicon-based semiconductor material, or may be formed of an oxide-based semiconductor material. Also, a light blocking layer may be further formed between the substrate 100 and the active layer 110, and in this situation, external light incident through a bottom of the substrate 100 can be blocked by the light blocking layer, thereby preventing the active layer 110 from being damaged by the external light.

The gate insulation layer 120 may be formed on the active layer 110. The gate insulation layer 120 can insulate the active layer 110 from the gate electrode 130. The gate insulation layer 120 may be formed of an inorganic insulating material, for example, silicon oxide (SiOx), silicon nitride (SiNx), or a multilayer thereof, but is not limited thereto.

The gate electrode 130 can be formed on the gate insulation layer 120. The gate electrode 130 may be formed to overlap the active layer 110 with the gate insulation layer 120 therebetween. The gate electrode 130 can be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof, but is not limited thereto.

The interlayer dielectric 140 can be formed on the gate electrode 130. The interlayer dielectric 140 may be formed of an inorganic insulating material (for example, silicon oxide (SiOx), silicon nitride (SiNx), or a multilayer thereof) which is the same as that of the gate insulation layer 120, but is not limited thereto.

The source electrode 150 and the drain electrode 160 can be formed on the interlayer dielectric 140 to face each other. The gate insulation layer 120 and the interlayer dielectric 140 may include a first contact hole CH1, exposing one area of the active layer 110, and a second contact hole CH2 which exposes the other area of the active layer 110. Accordingly, the source electrode 150 may be connected to the other area of the active layer 110 through the second contact hole CH2, and the drain electrode 160 can be connected to the one area of the active layer 110 through the first contact hole CH1.

In FIG. 2, the source electrode 150 and the drain electrode 160 are illustrated as a single layer, but are not limited thereto.

For example, the source electrode 150 may include a bottom source electrode and a top source electrode, and the bottom source electrode may be formed between the interlayer dielectric 140 and the top source electrode to enhance an adhesive force between the interlayer dielectric 140 and the top source electrode. Also, the bottom source electrode can protect a lower surface of the top source electrode, thereby preventing the lower surface of the top source electrode from being corroded. Therefore, an oxidation rate of the bottom source electrode may be lower than that of the top source electrode. That is, a material of the bottom source electrode may be a material having a corrosion resistance which is stronger than that of a material of the top source electrode. As described above, the bottom source electrode can act as an adhesion promotor or an anti-corrosion layer and may be formed of an alloy (MoTi) of molybdenum (Mo) and titanium (Ti), but is not limited thereto.

Moreover, the top source electrode can be formed on an upper surface of the bottom source electrode. The top source electrode may be formed of copper (Cu) which is metal having a low resistance, but is not limited thereto. The top source electrode may be formed of metal having a resistance which is relatively lower than that of the bottom source electrode. In order to decrease a total resistance of the source electrode 150, a thickness of the top source electrode can be set thicker than that of the bottom source electrode.

Similarly to the source electrode 150, the drain electrode 160 can also include a bottom drain electrode and a top drain electrode. However, the present embodiment is not limited thereto. In other embodiments, the source electrode 150 and the drain electrode 160 may each be formed of a multilayer including more layers than those of a triple layer.

A structure of the TFT layer T is not limited to a structure shown in the drawing, and may be variously modified into a structure known to those skilled in the art. For example, in the drawing, the TFT layer T is illustrated as having a top gate structure where the gate electrode 130 is provided on the active layer 110, but is not limited thereto. In other embodiments, the TFT layer T may be formed in a bottom gate structure where the gate electrode 130 is provided under the active layer 110.

The passivation layer 165 can be formed on the TFT layer T, and in more detail, may be formed on an upper surface of each of the source electrode 150 and the drain electrode 160. The passivation layer 165 may protect the TFT layer T and may be formed of an inorganic insulating material, for example, silicon oxide (SiOx), silicon nitride (SiNx), or a multilayer thereof, but is not limited thereto.

The planarization layer 170 may be formed on the passivation layer 165. The planarization layer 170 can planarize an upper surface of the substrate 100 on which the TFT layer T is provided. The passivation layer 170 may be formed of an organic insulating material such as acryl resin, epoxy resin, phenolic resin, polyamide resin, polyimide resin, and/or the like, but is not limited thereto.

The anode electrode 180 can be formed on the planarization layer 170. The passivation layer 165 and the planarization layer 170 can include a third contact hole CH3 which exposes the source electrode 150, and the source electrode 150 can be connected to the anode electrode 180 through the third contract hole CH3.

In a situation where the organic light emitting display device according to an embodiment of the present disclosure is implemented as a top emission type, since the anode electrode 180 should reflect light emitted from the organic light emitting layer 210 in an up direction, the anode electrode 180 can include a material which is good in reflectivity. On the other hand, in a situation where the organic light emitting display device according to an embodiment of the present disclosure is implemented as a bottom emission type, since the anode electrode 180 is provided on a surface through which light is output, the anode electrode 180 can be formed of a transparent conductive material such as indium tin oxide (ITO). The anode electrode 180 can be formed of a multilayer.

For example, the anode electrode 180 can include a bottom anode electrode, a top anode electrode, and a cover anode electrode. The bottom anode electrode can be provided between the planarization layer 170 and the top anode electrode to increase an adhesive force between the planarization layer 170 and the top anode electrode. The top anode electrode can be provided between the bottom anode electrode and the cover anode electrode. The top anode electrode may be formed of metal having a resistance which is relatively lower than that of each of the bottom anode electrode and the cover anode electrode. In order to decrease a total resistance of the anode electrode 180, a thickness of the top anode electrode can be set thicker than that of each of the bottom anode electrode and the cover anode electrode. The cover anode electrode may be provided on the top anode electrode. The cover anode electrode may be provided to cover an upper surface and a side surface of the top anode electrode, thereby preventing the top anode electrode from being corroded. Accordingly, an oxidation rate of the cover anode electrode can be lower than that of the top anode electrode. That is, the cover anode electrode can be formed of a material having a corrosion resistance which is stronger than that of a material of the top anode electrode.

However, the present embodiment is not limited thereto. In other embodiments, the anode electrode 180 can be formed of a double layer or a multilayer including more layers than those of a quadruple layer.

The auxiliary electrode 190 can be provided on an upper surface of the anode electrode 180. The auxiliary electrode 190 can be provided to directly contact the upper surface of the anode electrode 180. That is, a separate insulation layer is not provided between the auxiliary electrode 190 and the anode electrode 180, and thus, a process of forming an insulation layer and a contact hole may be omitted.

In a situation where the organic light emitting display device according to an embodiment of the present disclosure is implemented as the top emission type, since the auxiliary electrode 190 should reflect the light emitted from the organic light emitting layer 210 in an up direction, the auxiliary electrode 190 can include a material which is good in reflectivity. On the other hand, in a situation where the organic light emitting display device according to an embodiment of the present disclosure is implemented as the bottom emission type, since the auxiliary electrode 190 is provided on a surface through which light is output, the auxiliary electrode 190 can be formed of a transparent conductive material.

Particularly, in a situation where the auxiliary electrode 190 is provided on the anode electrode 180 and the organic light emitting display device according to an embodiment of the present disclosure is implemented as the bottom emission type, the light emitted from the organic light emitting layer 210 can pass through the anode electrode 180 and the auxiliary electrode 190 and can be output to the outside. In this situation, in the organic light emitting display device according to an embodiment of the present disclosure, in order to enhance light emission, the auxiliary electrode 190 can be formed of a material having a refractive index which is higher than that of the anode electrode 180. For example, in a situation where the anode electrode 180 is formed of ITO which is a transparent conductive material, the auxiliary electrode 190 can be formed of indium zinc oxide (IZO) having a refractive index which is higher than that of ITO, but the present embodiment is not limited thereto.

As described above, in an embodiment of the present disclosure, a refractive index difference between boundary surfaces through which the light emitted from the organic light emitting layer 210 passes increases, and thus, a light emission of the organic light emitting display device is enhanced. This will be described below in more detail.

In a situation where the auxiliary electrode 190 is not provided, the organic light emitting layer 210 can be directly provided on the anode electrode 180, and the light emitted from the organic light emitting layer 210 may pass through a boundary surface between the organic light emitting layer 210 and the anode electrode 180 and may be output to a lower portion. In this situation, since the organic light emitting layer 210 is formed of an organic material, the organic light emitting layer 210 can have a refractive index of about 1.5, and the anode electrode 180 formed of ITO can have a refractive index of about 1.7. Also, based on the Snell's law, when light is incident from a medium having a low refractive index to a medium having a high refractive index, a refractive angle of the light may have a value which is less than an incident angle. In this situation, the incident angle may denote an angle between the incident light and a normal line in a boundary surface between two mediums, and the refractive angle may denote an angle between refracted light and the normal line. That is, the light which is incident from the medium having the low refractive index to the medium having the high refractive index may be refracted in a direction parallel with the normal line, namely, in a direction vertical to the boundary surface.

Therefore, in an embodiment of the present disclosure, the light emitted from the organic light emitting layer 210 can travel to a material having a refractive index which is higher than that of the organic light emitting layer 210, thereby enhancing light efficiency. Particularly, as a refractive index difference between the organic light emitting layer 210 and a layer adjacent thereto increases, the light emitted from the organic light emitting layer 210 can be refracted in a direction parallel with the normal line and can travel. Accordingly, in an embodiment of the present disclosure, the auxiliary electrode 190 including a material such as IZO having a refractive index (a refractive index of 2.0) which is higher than that of ITO can be additionally provided on the anode electrode 180 including ITO, thereby enhancing an efficiency of light emitted in a down direction.

Moreover, in the organic light emitting display device according to an embodiment of the present disclosure, since the auxiliary electrode 190 is additionally provided on the anode electrode 180, the following enhanced effects are obtained.

As described above, in a related art soluble organic light emitting display device, a foreign material or a residual layer including an organic material remains on an anode electrode in a process of forming a bank including an organic material. However, in the organic light emitting display device according to an embodiment of the present disclosure, the auxiliary electrode 190 can be additionally provided on the anode electrode 180, but a residual layer or a foreign material on the auxiliary electrode 190 can be removed in a process of etching a portion of the auxiliary electrode 190, thereby forming a clean upper surface of the auxiliary electrode 190.

As a result, the auxiliary electrode 190 can be provided to have different heights in an area covered by the bank 200 and an opening area exposed by the bank 200, and as illustrated in FIG. 2, a first height H1 of the auxiliary electrode 190 provided in the area covered by the bank 200 can have a value greater than that of a second height H2 of the auxiliary electrode 190 provided in the opening area exposed by the bank 200.

Moreover, in the organic light emitting display device according to an embodiment of the present disclosure, since the auxiliary electrode 190 is formed of IZO on the anode electrode 180, and the anode electrode 180 can be formed of ITO, the following enhanced effects are obtained.

ITO and IZO can be etched by the same etchant including KOH, $H_2O_2$, and acid. Therefore, in a process of forming the anode electrode 180 and the auxiliary electrode 190, materials for forming the anode electrode 180 and the auxiliary electrode 190 can be provided on the planarization layer 170, and by etching the materials with the same etchant, the anode electrode 180 and the auxiliary electrode 190 can be simultaneously patterned. Accordingly, in the organic light emitting display device according to an embodiment of the present disclosure, the auxiliary electrode 190 can be formed without adding a mask process.

Moreover, since IZO is easy to etch in comparison with ITO, a degree to which the bank 200 including an organic material is damaged by the etchant is minimized in a process of etching the upper surface of the auxiliary electrode 190.

As described above, in the organic light emitting display device according to an embodiment of the present disclosure, since the auxiliary electrode 190 is provided on the anode electrode 180, an efficiency of the light emitted from the organic light emitting layer 210 is enhanced, and a foreign material or a residual layer including an organic material is completely removed, thereby increasing an operable lifetime.

The bank 200 can be provided on the auxiliary electrode 190.

The bank 200 can be provided on each of one side and the other side of the auxiliary electrode 190 to expose the upper surface of the auxiliary electrode 190. Since the bank 200 is provided to expose the upper surface of the auxiliary electrode 190, an area on which an image is displayed is secured. Also, since the bank 200 is provided on each of the one side and the other side of the auxiliary electrode 190, a side surface of the auxiliary electrode 190 vulnerable to corrosion is not exposed to the outside, thereby preventing the side surface of the auxiliary electrode 190 from being corroded. In this situation, the organic light emitting layer 210 and the cathode electrode 220 can be provided on the upper surface of the auxiliary electrode 190, and an exposed area, where the organic light emitting layer 210 and the cathode electrode 220 are to be formed, of the auxiliary electrode 190 can correspond to an emissive area EA.

The bank 200 can be formed of an organic insulating material such as polyimide resin, acryl resin, benzocyclobutene (BCB), and/or the like, but is not limited thereto.

Particularly, the bank 200 according to an embodiment of the present disclosure can be wholly formed of a hydrophilic material, or only an upper surface of the bank 200 can be formed of a hydrophobic material. That is, the organic light emitting layer 210 and the cathode electrode 220 can be provided on the auxiliary electrode 190 exposed by the bank 200, and in this situation, since the organic light emitting layer 210 and the cathode electrode 220 should be provided to have a uniform thickness on the auxiliary electrode 190, in an embodiment of the present disclosure, a side surface of the bank 200 can be formed of a hydrophilic material. Therefore, the organic light emitting layer 210 can be provided to extend to only the side surface of the bank 200 without passing by the upper surface of the bank 200, and the organic light emitting layer 210 can be uniformly provided up to the side surface of the bank 200, whereby the organic light emitting layer 210 can be planarly provided in the emissive area EA.

Hereinabove, an area having hydrophobicity is described as the upper surface of the bank 200, but the present embodiment is not limited thereto. In other embodiments, an area corresponding to a certain height from the upper surface of the bank 200 may include a hydrophobic material, and another area may include a hydrophilic material.

The organic light emitting layer 210 can be provided on the auxiliary electrode 190. The organic light emitting layer 210 can be provided on the auxiliary electrode 190 exposed by the bank 200. The organic light emitting layer 210 can include a hole injecting layer, a hole transporting layer, a light emitting layer, an electron transporting layer, and an electron injecting layer. A structure of the organic light emitting layer 210 may be modified into a structure known to those skilled in the art.

Particularly, at least one of the hole injecting layer, the hole transporting layer, the light emitting layer, the electron transporting layer, and the electron injecting layer configuring the organic light emitting layer 210 may be formed through a soluble process. For example, the hole injecting layer, the hole transporting layer, and the light emitting layer may be formed through the soluble process, and the electron transporting layer and the electron injecting layer can be formed through a vapor deposition process. However, the present embodiment is not limited thereto.

As described above, the soluble process can be a process where a soluble organic light emitting material is sprayed on the auxiliary electrode 190 through an inkjet printing process, and by curing the soluble organic light emitting material, the organic light emitting layer 210 is formed, and is used for increasing the convenience and efficiency of a process of manufacturing the organic light emitting display device.

The cathode electrode 220 can be provided on the organic light emitting layer 210. In a situation where the organic light emitting display device according to an embodiment of the present disclosure is implemented as the top emission type, since the cathode electrode 220 is provided on a surface through which light is output, the cathode electrode 220 can be formed of a transparent conductive material. On the other hand, in a situation where the organic light emitting display device according to an embodiment of the present disclosure is implemented as the bottom emission type, since the cathode electrode 220 should reflect the light emitted from the organic light emitting layer 210 in a down direction, the cathode electrode 220 can include a material which is good in reflectivity.

In addition, an encapsulation layer can be additionally provided on the cathode electrode 220 to prevent penetration of water.

As described above, the organic light emitting display device according to an embodiment of the present disclosure can be implemented in a structure enabling the top emission type, where the light emitted from the organic light emitting layer 210 is output to the outside through the cathode electrode 220, or the bottom emission type where the light emitted from the organic light emitting layer 210 is output to the outside through the anode electrode 180 and the auxiliary electrode 190, but is not limited thereto. In other embodiments, the organic light emitting display device according to an embodiment of the present disclosure can be implemented in a dual emission type.

Figure 3:
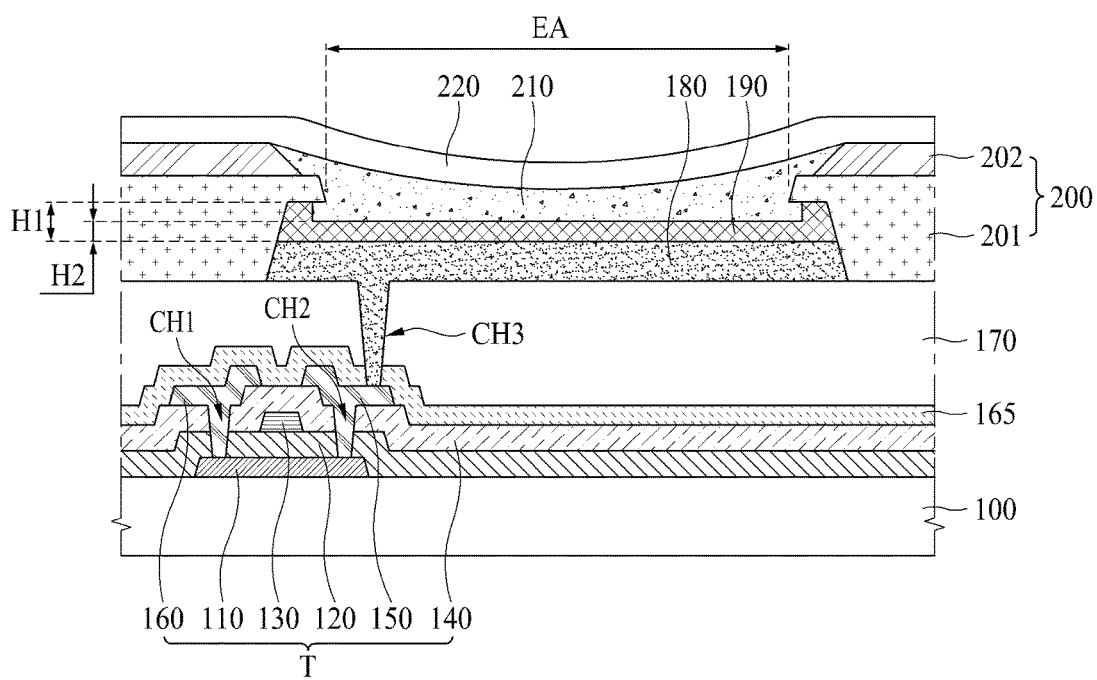
FIG. 3 is a cross-sectional view of an organic light emitting display device according to an embodiment of the present disclosure.

FIG. 3 is a cross-sectional view of an organic light emitting display device according to a second embodiment of the present disclosure.

In the organic light emitting display device according to the second embodiment of the present disclosure illustrated in FIG. 3, a bank can be formed of a multilayer. Therefore, except that arrangement of some elements are changed, the organic light emitting display device illustrated in FIG. 3 is the same as the organic light emitting display device of FIG. 2. Hereinafter, therefore, like reference numerals refer to like elements, and only different elements will be described.

As illustrated in FIG. 3, the organic light emitting display device according to the second embodiment of the present disclosure can include a TFT layer T, a passivation layer 165, a planarization layer 170, an anode electrode 180, an auxiliary electrode 190, a bank 200, an organic light emitting layer 210, and a cathode electrode 220 which are formed on a substrate 100. The bank 200 can be formed of a multilayer including a first bank 201 and a second bank 202.

The first bank 201 can be provided on each of one side and the other side of each of the anode electrode 180 and the auxiliary electrode 190 to expose an upper surface of the auxiliary electrode 190, and the second bank 202 can be provided on the first bank 201 to expose an upper surface of the first bank 201. Particularly, the second bank 202 can be provided to expose an edge top of the first bank 201.

In this manner, in an embodiment of the present disclosure, since the second bank 202 is provided on the first bank 201 to expose an edge of the first bank 201, the bank 200 may be wholly provided in a shape having a step height on the auxiliary electrode 190 as illustrated in FIG. 3.

In an embodiment of the present disclosure, that the second bank 202 is provided on the first bank 201 to expose the edge of the first bank 201 for preventing a pileup phenomenon of the organic light emitting layer 210.

The pileup phenomenon denotes that in a situation of forming the organic light emitting layer 210 through the inkjet printing process, in performing a process where an organic light emitting material of the organic light emitting layer 210 is sprayed or dropped on the auxiliary electrode 190 and then is dried, the organic light emitting material is dried and cured, and then, a thickness of the organic light emitting layer 210 provided in an area contacting the bank 200 is set thicker than that of the organic light emitting layer 210 provided on an upper surface of the auxiliary electrode 190, causing a thickness deviation.

As a result, the organic light emitting layer 210 can be planarly provided in a center of an emissive area EA corresponding to the auxiliary electrode 190 exposed by the bank 200 and can have a cross-sectional surface having a thickness which increases progressively closer to a portion adjacent to the bank 200. Also, if the organic light emitting layer 210 is not planarly provided on the auxiliary electrode 190, luminance non-uniformity occurs.

Therefore, in an embodiment of the present disclosure, the bank 200 provided on each of the one side and the other side of each of the anode electrode 180 and the auxiliary electrode 190 can include the first bank 201 and the second bank 202 to have a step height having a stepped shape, and thus, the pileup phenomenon is prevented.

As described above, in a state where the first bank 201 and the second bank 202 are provided to have the step height having a stepped shape, an organic light emitting material may be sprayed on an upper surface of the auxiliary electrode 190 exposed by the first bank 201 and an upper surface of the first bank 201 exposed by the second bank 202, the organic light emitting layer 210 may be planarly provided on the auxiliary electrode 190 corresponding to the emissive area EA. That is, in an embodiment of the present disclosure, the organic light emitting layer 210 can be provided on an edge top of the first bank 201, and thus, can be planarly provided in the emissive area EA.

To this end, the first bank 201 can be provided to wholly have a hydrophilic characteristic, and the second bank 202 can be provided to wholly have a hydrophobic characteristic or only an upper portion thereof can be provided to have a hydrophobic characteristic. That is, as described above, in an embodiment of the present disclosure, the organic light emitting layer 210 can be provided to extend to the upper surface of the first bank 201, in order for the pileup phenomenon not to occur in an exposed area of the auxiliary electrode 190 corresponding to the emissive area EA.

Therefore, the first bank 201 may be formed of a hydrophilic material, and the organic light emitting layer 210 may be provided on the upper surface of the first bank 201. Also, the second bank 202 can be formed of a hydrophobic material to define a pixel area by restricting an area where the organic light emitting layer 210 is provided. However, if the organic light emitting layer 210 is not provided on the upper surface of the second bank 202, the pixel area may be defined, and thus, only the upper surface of the second bank 202 can be formed of a hydrophobic material.

Moreover, a distance between the upper surface of the first bank 210 and the upper surface of the auxiliary electrode 190 can be set shorter than a distance between the upper surface of the second bank 202 and the upper surface of the first bank 201. That is, if the organic light emitting layer 190 can be provided on the upper surface of the first bank 201 in order for the organic light emitting layer 190 to be planarliy provided on the auxiliary electrode 190, the first bank 201 can be provided to have a relatively thin thickness, but since the second bank 202 should define the pixel area in addition to restricting the area where the organic light emitting layer 210 is provided, the second bank 202 can be provided to have a thickness which is relatively thicker than that of the first bank 201.

Moreover, a side surface of the second bank 202 can be inclined at a certain angle with respect to a surface of the substrate 100. In detail, as illustrated in FIG. 3, a viewing angle between the side surface of the second bank 202 and the surface of the substrate 100 can be adjusted to 45 degrees or less.

That is, when the organic light emitting layer 210 is provided on the side surface of the second bank 202 which is gently inclined, a deviation of a thickness of the organic light emitting layer 210 is reduced, and when the organic light emitting layer 210 is provided on the side surface of the second bank 202 which is steeply inclined, the deviation of the thickness of the organic light emitting layer 210 increases. Therefore, in an embodiment of the present disclosure, the side surface of the second bank 202 can be inclined at a gentle angle, and thus, the organic light emitting layer 210 provided on the auxiliary electrode 190 can be planarized. In this situation, the viewing angle is not limited to the angle and may be modified based on a viscosity of an organic light emitting material or an area of the upper surface of the first bank 201 exposed by the second bank 202. Also, since the organic light emitting layer 210 is provided on the edge top of the first bank 201, an angle between a side surface 201a of the first bank 201 and the surface of the substrate 100 is not limited to a specific value.

As described above, the anode electrode 180 can be formed of a material having a refractive index which is higher than that of the organic light emitting layer 210, and the auxiliary electrode 190 can be formed of a material having a refractive index which is higher than that of the anode electrode 180. That is, since light which is incident from a medium having a low refractive index to a medium having a high refractive index is refracted in a direction parallel with the normal line, in an embodiment of the present disclosure, the anode electrode 180 can be formed of a material having a refractive index higher than that of the organic light emitting layer 210 so that the light emitted from the organic light emitting layer 210 is refracted in a direction parallel with a normal line of a boundary surface between the organic light emitting layer 210 and the anode electrode 180 and travels.

Particularly, as a refractive index difference between the organic light emitting layer 210 and a layer adjacent thereto increases, the light emitted from the organic light emitting layer 210 may be refracted in a direction parallel with the normal line and may travel. Accordingly, in an embodiment of the present disclosure, the auxiliary electrode 190 including a material such as IZO having a refractive index (a refractive index of 2.0) which is higher than that of ITO can be additionally provided on the anode electrode 180 including ITO, thereby enhancing an efficiency of light emitted in a down direction.

Moreover, in the organic light emitting display device according to the second embodiment of the present disclosure, since the auxiliary electrode 190 is additionally provided on the anode electrode 180, the following enhanced effects are obtained.

As described above, in a related art soluble organic light emitting display device, a foreign material or a residual layer including an organic material remains on an anode electrode in a process of forming a bank including an organic material. However, in the organic light emitting display device according to an embodiment of the present disclosure, the auxiliary electrode 190 can be additionally provided on the anode electrode 180, but a residual layer or a foreign material on the auxiliary electrode 190 can be removed in a process of etching a portion of the auxiliary electrode 190, thereby forming a clean upper surface of the auxiliary electrode 190.

As a result, the auxiliary electrode 190 can be provided to have different heights in an area covered by the bank 200 and an opening area exposed by the bank 200, and a first height H1 of the auxiliary electrode 190 provided in the area covered by the bank 200 can have a value greater than that of a second height H2 of the auxiliary electrode 190 provided in the opening area exposed by the bank 200.

As described above, in the organic light emitting display device according to the second embodiment of the present disclosure, since the auxiliary electrode 190 is provided on the anode electrode 180, an efficiency of the light emitted from the organic light emitting layer 210 is enhanced, and a foreign material or a residual layer including an organic material is completely removed, thereby increasing an operable lifetime.

Moreover, in the organic light emitting display device according to the second embodiment of the present disclosure, since the second bank 202 provided in an upper portion of the bank 200 having a stepped structure includes a hydrophobic material and the first bank 201 provided in a lower portion of the bank 200 includes a hydrophilic material, the organic light emitting layer 210 can be planarly provided on the upper surface of the auxiliary electrode 190, thereby realizing uniform luminance.

Moreover, in the organic light emitting display device according to the second embodiment of the present disclosure, the side surface of the second bank 202 which is provided to expose the edge of the first bank 201 can be inclined with respect to the surface of the substrate 100, and thus, the organic light emitting layer 210 can be more planarly provided on the upper surface of the auxiliary electrode 190, thereby realizing uniform luminance.

The organic light emitting layer 210 can extend to the upper surface of the first bank 201 exposed by the second bank 202. However, the organic light emitting layer 210 does not cover the upper surface of the second bank 202, and moreover, does not extend to the upper surface of the second bank 202.

To this end, as described above, the first bank 201 may be wholly formed of a hydrophilic material, and the second bank 202 may be wholly formed of a hydrophobic material or only an upper portion thereof may be formed of a hydrophobic material.

In addition, an encapsulation layer can be additionally provided on the cathode electrode 220 to prevent penetration of water. The encapsulation layer may use various materials known to those skilled in the art.

FIGS. 4A to 4F are process cross-sectional views illustrating a method of manufacturing an organic light emitting display device according to a first embodiment of the present disclosure and relate to a method of manufacturing the organic light emitting display device of FIG. 2. Hereinafter, therefore, like reference numerals refer to like elements throughout, and in a material and a structure of each element, repetitive descriptions are omitted.

Figure 4A:
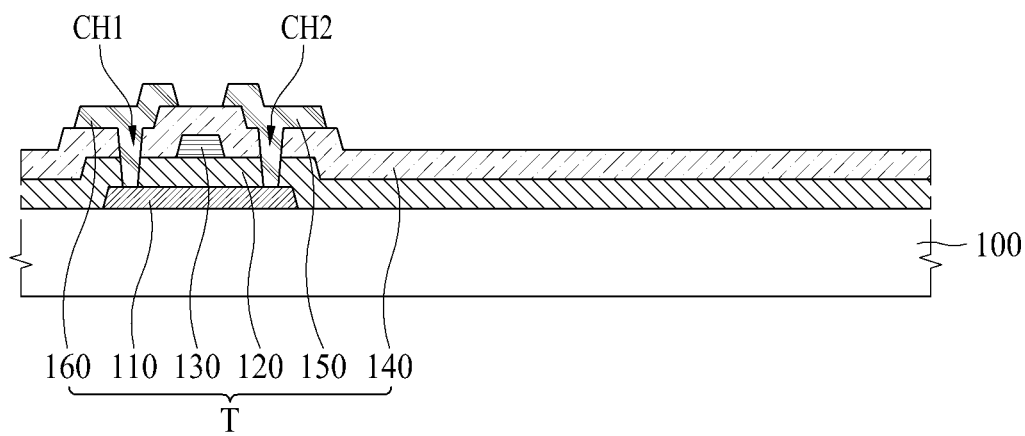
FIGS. 4A to 4F are process cross-sectional views illustrating a method of manufacturing an organic light emitting display device according to an embodiment of the present disclosure.

First, as shown in FIG. 4A, an active layer 110, a gate insulation layer 120, a gate electrode 130, an interlayer dielectric 140, a source electrode 150, and a drain electrode 160 can be sequentially formed on a substrate 100.

To provide a more detailed description, the active layer 110 can be formed on the substrate 100, the gate insulation layer 120 can be formed on the active layer 110, the gate electrode 130 can be formed on the gate insulation layer 120, the interlayer dielectric 140 can be formed on the gate electrode 130, a first contact hole CH1 and a second contact hole CH2 may be formed in the gate insulation layer 120 and the interlayer dielectric 140, and the drain electrode 160 connected to one area of the active layer 110 through the first contact hole CH1 and the source electrode 150 connected to the other area of the active layer 110 through the second contact hole CH2 can be formed.

The source electrode 150 and the drain electrode 160 can each be formed of a multilayer. The source electrode 150 and the drain electrode 160 can be simultaneously formed of the same material through the same patterning process.

Figure 4B:
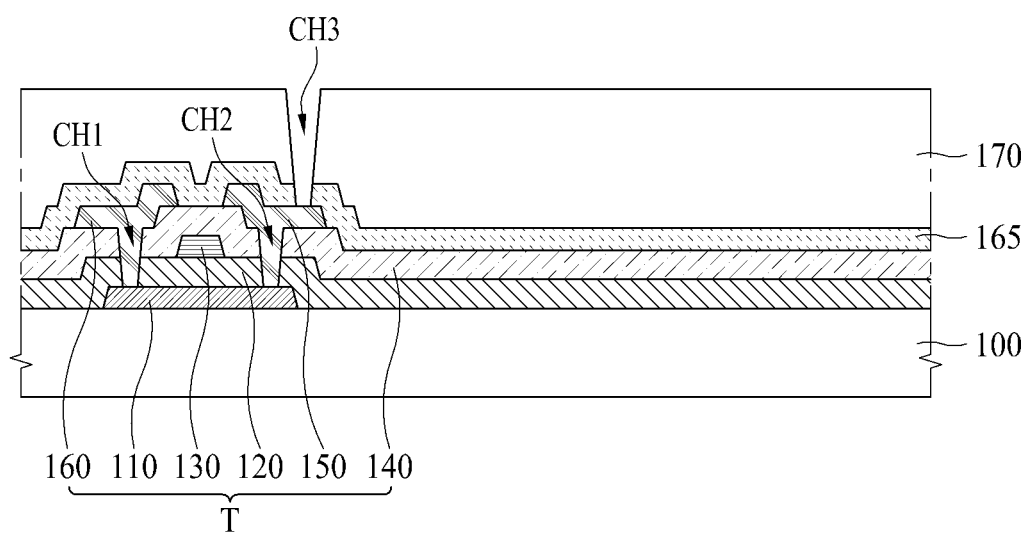

Subsequently, as shown in FIG. 4B, a passivation layer 165 can be formed on the source electrode 150 and the drain electrode 160, and a planarization layer 170 can be formed on the passivation layer 165.

The passivation layer 165 and the planarization layer 170 can be formed to have a third contact hole CH3, and thus, the source electrode 150 can be exposed to the outside through the third contact hole CH3.

Figure 4C:
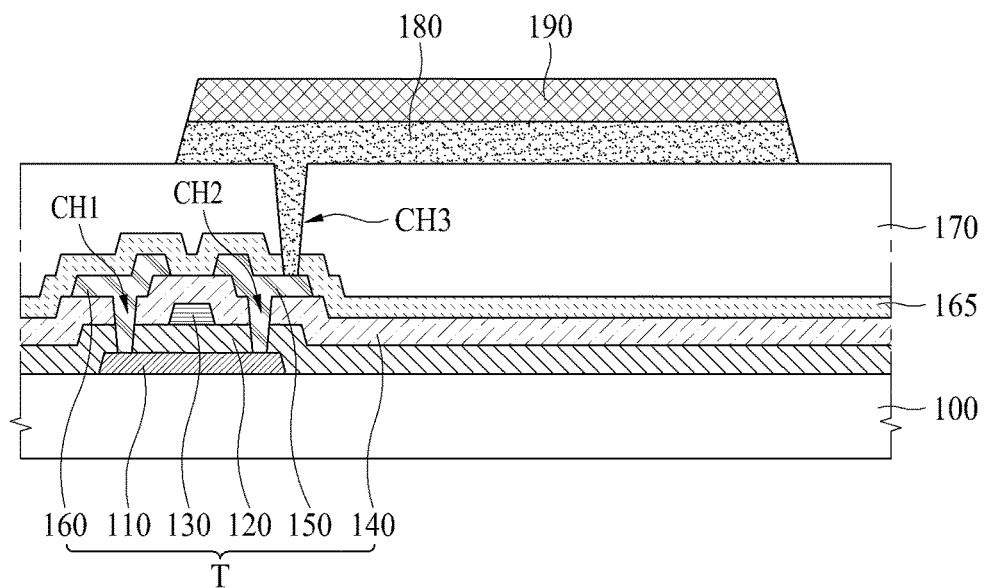

Subsequently, as shown in FIG. 4C, an anode electrode 180 and an auxiliary electrode 190 can be sequentially formed on the planarization layer 170.

The anode electrode 180 can be connected to the source electrode 150 through the third contact hole CH3. The auxiliary electrode 190 can be formed of a material having a refractive index which is higher than that of the anode electrode 180. For example, the anode electrode 180 can be formed of ITO, and the auxiliary electrode 190 can be formed of IZO.

ITO and IZO may be etched by the same etchant including KOH, $H_2O_2$, and acid. Therefore, in a process of forming the anode electrode 180 and the auxiliary electrode 190, materials for forming the anode electrode 180 and the auxiliary electrode 190 can be provided on the planarization layer 170, and by etching the materials with the same etchant, the anode electrode 180 and the auxiliary electrode 190 can be simultaneously patterned. Accordingly, in the organic light emitting display device according to an embodiment of the present disclosure, the auxiliary electrode 190 can be formed without adding a mask process.

Figure 4D:
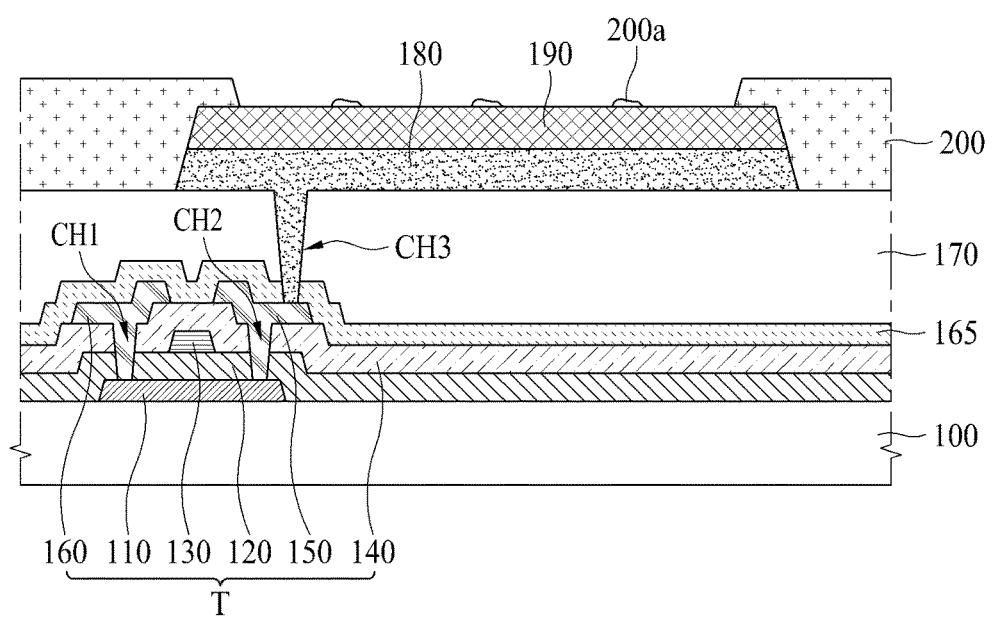

Subsequently, as shown in FIG. 4D, a bank 200 can be formed on the auxiliary electrode 190. In detail, the bank 200 can be formed on each of one side and the other side of the auxiliary electrode 190 to expose an upper surface of the auxiliary electrode 190. As illustrated in FIG. 4D, a process of patterning the bank 200 on each of one side and the other side of the auxiliary electrode 190 may use a photolithography process, and the bank 200 may be patterned through various technologies known to those skilled in the art.

In a process of forming the bank 200 on the auxiliary electrode 190, hydrophobic treatment can be performed on the bank 200 in order for an upper surface of the bank 200 to have hydrophobicity. A method of performing the hydrophobic treatment on the upper surface of the bank 200 may use various technologies known to those skilled in the art. For example, in a process of patterning the bank 200 with a mask, the hydrophobic treatment can be performed on the upper surface of the bank 200 by adjusting a degree of exposure performed on the bank 200, or by using a coating apparatus such as a roller with a hydrophobic material coated thereon, the hydrophobic material can be coated on the upper surface of the bank 200, but the present embodiment is not limited thereto.

Figure 4E:
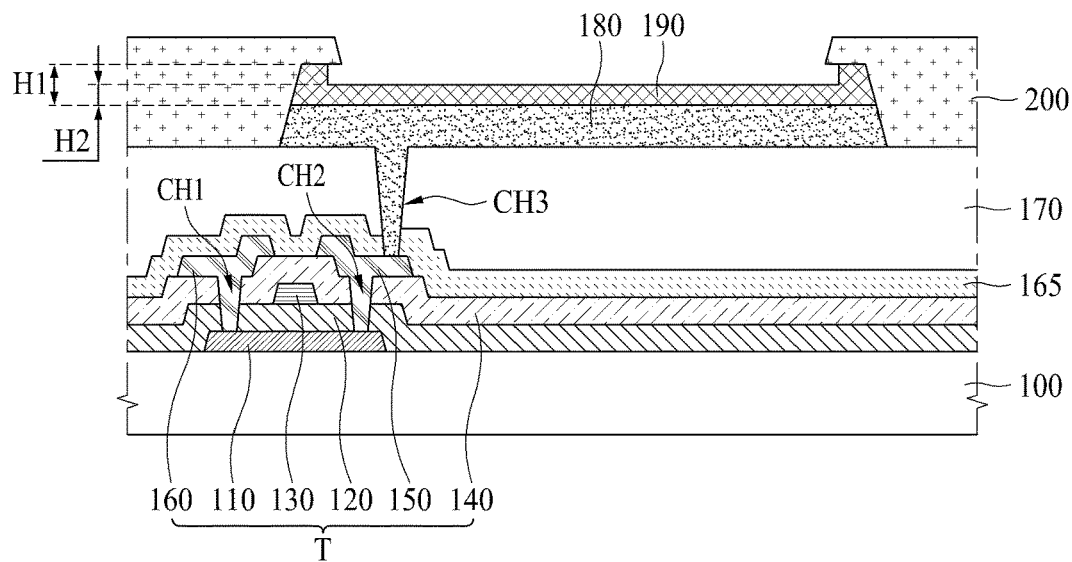

Subsequently, as shown in FIG. 4E, a portion of the auxiliary electrode 190 can be etched by using the bank 200 as a mask. As described above, when the auxiliary electrode 190 is formed of ITO, only IZO can be selectively etched, and in this situation, an etchant including KOH, $H_2O_2$, and acid which do not damage the anode electrode 180 including ITO and the bank 200 including an organic material may be used. However, the present embodiment is not limited thereto, and thus, the etchant may be used based on a material of the auxiliary electrode 190.

In detail, as illustrated in FIG. 4D, the organic material can remain as a residual layer or a foreign material 200a in an opening area of the auxiliary electrode exposed by the bank 200 in a process of patterning the bank 200 including the organic material.

In the related art, surface treatment technology using plasma or EUV is used for removing the foreign material 200a, but a hydrophobic area of the upper surface of the bank 200 for which the hydrophobic treatment has been performed is removed together. Therefore, in an embodiment of the present disclosure, although the portion of the auxiliary electrode 190 is etched, the upper surface of the auxiliary electrode 190 and the foreign material 200a are simultaneously removed in the etching process, and thus, the auxiliary electrode including a planar and clean upper surface is obtained.

Particularly, as described above, in an embodiment of the present disclosure, the auxiliary electrode 190 can be formed of a material having a refractive index which is higher than that of the anode electrode 180, and in this situation, since the auxiliary electrode 190 is formed on the anode electrode 180, a refractive index difference between boundary surfaces through which light emitted from the organic light emitting layer 210 passes increases, thereby enhancing a light emission of the organic light emitting display device. That is, a whole portion of the auxiliary electrode 190 can be removed in a process of etching the auxiliary electrode 190 for removing the foreign material 200a, but in an embodiment of the present disclosure, the auxiliary electrode 190 can be provided on the anode electrode 180 in an opening area exposed by the bank 200 without removing the whole portion of the auxiliary electrode 190, thereby enhancing light efficiency.

Figure 4F:
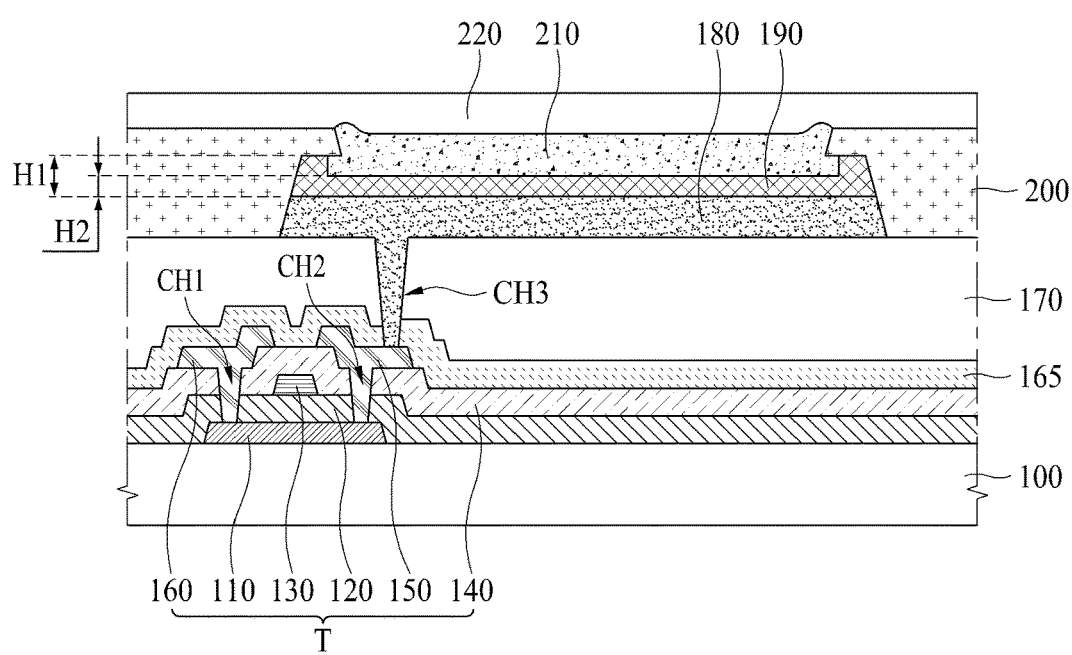

Subsequently, as shown in FIG. 4F, the organic light emitting layer 210 and a cathode electrode 220 can be sequentially formed on the auxiliary electrode 190. The organic light emitting layer 210 can be formed by spraying a soluble organic light emitting material through the inkjet printing process, and as described above, the upper surface of the bank 200 may be formed of a hydrophobic material. Accordingly, the organic light emitting layer 210 can be deposited up to the upper surface of the auxiliary electrode 190 and a side surface of the bank 200, but is not deposited on the upper surface of the bank 200.

That is, in an embodiment of the present disclosure, the bank 200 can be wholly formed of a hydrophilic material, and only the upper surface of the bank 200 can be formed of a hydrophobic material, thereby preventing the organic light emitting layer 210 from being distributed to an emissive area of another pixel other than the upper surface of the bank 200.

FIGS. 5A to 5F are process cross-sectional views illustrating a method of manufacturing an organic light emitting display device according to a second embodiment of the present disclosure and relate to a method of manufacturing the organic light emitting display device of FIG. 3. Hereinafter, therefore, like reference numerals refer to like elements throughout, and in a material and a structure of each element, repetitive descriptions are omitted.

Figure 5A:
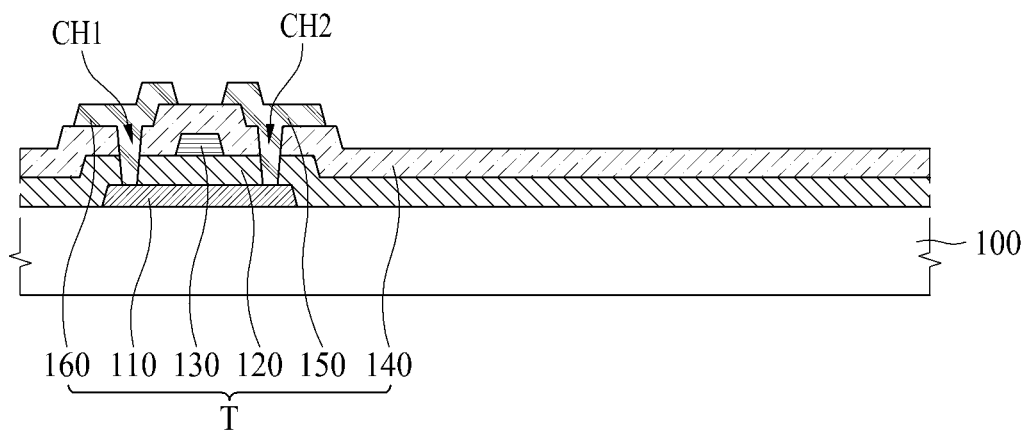
FIGS. 5A to 5F are process cross-sectional views illustrating a method of manufacturing an organic light emitting display device according to an embodiment of the present disclosure.

First, as shown in FIG. 5A, an active layer 110, a gate insulation layer 120, a gate electrode 130, an interlayer dielectric 140, a source electrode 150, and a drain electrode 160 can be sequentially formed on a substrate 100.

To provide a more detailed description, the active layer 110 can be formed on the substrate 100, the gate insulation layer 120 may be formed on the active layer 110, the gate electrode 130 may be formed on the gate insulation layer 120, the interlayer dielectric 140 may be formed on the gate electrode 130, a first contact hole Cu 1 and a second contact hole CH2 may be formed in the gate insulation layer 120 and the interlayer dielectric 140, and the drain electrode 160 connected to one area of the active layer 110 through the first contact hole CH1 and the source electrode 150 connected to the other area of the active layer 110 through the second contact hole CH2 may be formed.

The source electrode 150 and the drain electrode 160 can each be formed of a multilayer. The source electrode 150 and the drain electrode 160 can be simultaneously founed of the same material through the same patterning process.

Figure 5B:
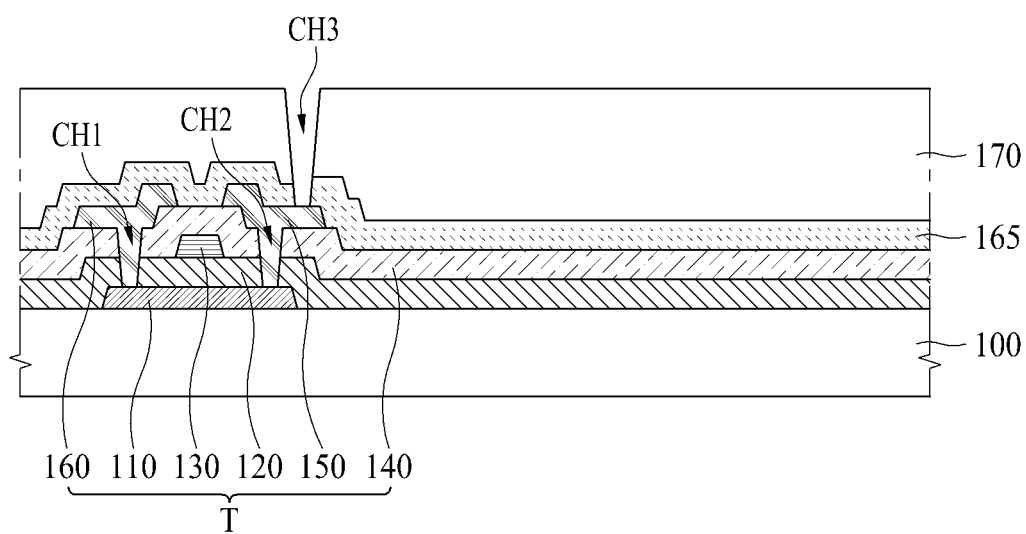

Subsequently, as shown in FIG. 5B, a passivation layer 165 can be formed on the source electrode 150 and the drain electrode 160, and a planarization layer 170 can be formed on the passivation layer 165.

The passivation layer 165 and the planarization layer 170 may be formed to have a third contact hole CH3, and thus, the source electrode 150 may be exposed to the outside through the third contact hole CH3.

Figure 5C:
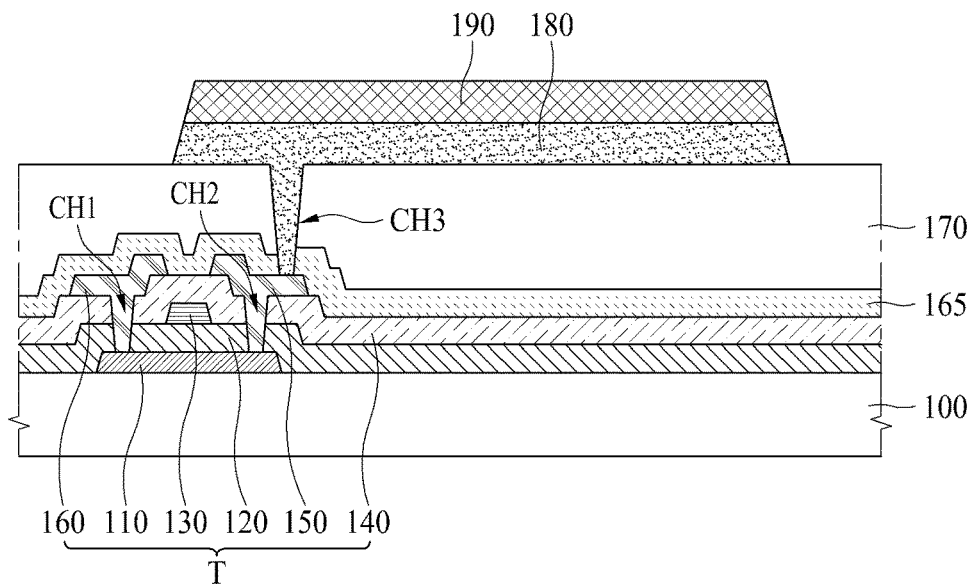

Subsequently, as shown in FIG. 5C, an anode electrode 180 and an auxiliary electrode 190 can be sequentially formed on the planarization layer 170.

The anode electrode 180 may be connected to the source electrode 150 through the third contact hole CH3. The auxiliary electrode 190 may be formed of a material having a refractive index which is higher than that of the anode electrode 180. For example, the anode electrode 180 can be formed of ITO, and the auxiliary electrode 190 can be formed of IZO.

ITO and IZO can be etched by the same etchant including KOH, $H_2O_2$, and acid. Therefore, in a process of forming the anode electrode 180 and the auxiliary electrode 190, materials for forming the anode electrode 180 and the auxiliary electrode 190 can be provided on the planarization layer 170, and by etching the materials with the same etchant, the anode electrode 180 and the auxiliary electrode 190 can be simultaneously patterned. Accordingly, in the organic light emitting display device according to an embodiment of the present disclosure, the auxiliary electrode 190 can be formed without adding a mask process.

Figure 5D:
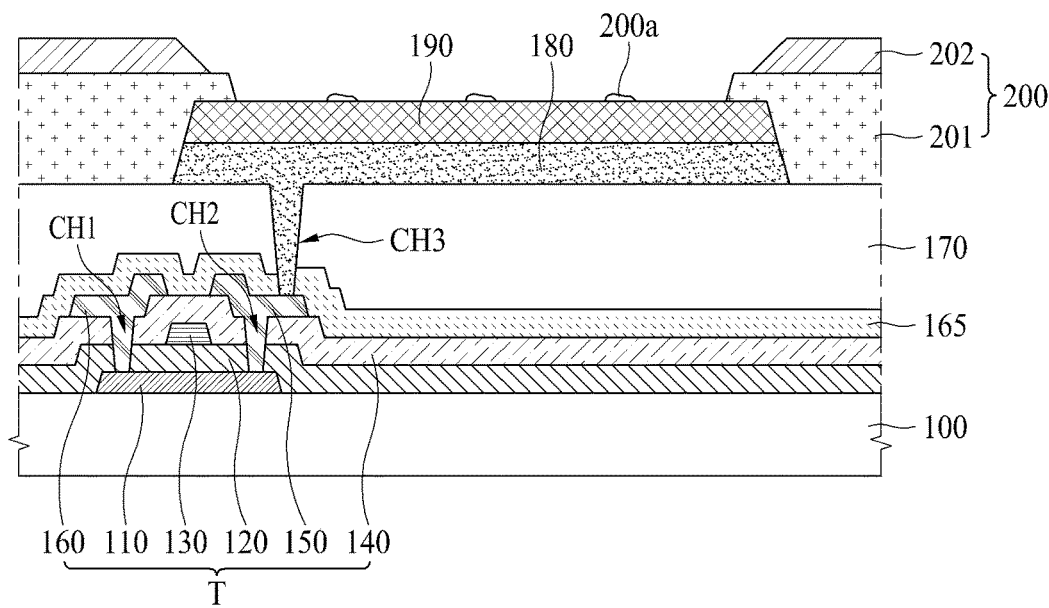

Subsequently, as shown in FIG. 5D, a first bank 201 and a second bank 202 can be sequentially formed on the auxiliary electrode 190. In detail, the first bank 201 can be formed on each of one side and the other side of the auxiliary electrode 190 to expose an upper surface of the auxiliary electrode 190, and the second bank 202 can be formed on the first bank 201 to expose the upper surface of the auxiliary electrode 190 exposed by the first bank 201 and an edge of the first bank 201. As illustrated in FIG. 5D, a process of patterning the first bank 201 and the second bank 202 on one side and the other side of the auxiliary electrode 190 may use a photolithography process, and the first bank 201 and the second bank 202 may be patterned through various technologies known to those skilled in the art.

In a process of forming the first bank 201 and the second bank 202 on the auxiliary electrode 190, the first bank 201 can be formed of a hydrophilic material, and the second bank 202 can be formed of a hydrophobic material. That is, in an embodiment of the present disclosure, in order for the pileup phenomenon not to occur in an exposed area of the auxiliary electrode 190 corresponding to an emissive area, the organic light emitting layer 210 should be formed to extend to the upper surface of the first bank 201 exposed by the second bank 202. Therefore, in an embodiment of the present disclosure, since the first bank 201 is formed of a hydrophilic material, the organic light emitting layer 210 can be formed to extend to the upper surface of the first bank 201, and since the second bank 202 is formed of a hydrophobic material, an area where the organic light emitting layer 210 is provided may be restricted in order for the organic light emitting layer 210 not to penetrate into another pixel area.

However, in an embodiment of the present disclosure, a situation where the second bank 202 restricts the area where the organic light emitting layer 210 is provided is good enough for the second bank 202, and thus, the second bank 202 may be formed of a hydrophobic organic material or not. For example, the second bank 202 may be formed of a hydrophilic organic material, and hydrophobic treatment can be performed on the second bank 202 in order for an upper surface of the second bank 202 to have hydrophobicity. That is, in a process of patterning the second bank 202, the hydrophobic treatment may be performed on the upper surface of the second bank 202 by adjusting a degree of exposure performed on the second bank 202, or by using a coating apparatus such as a roller with a hydrophobic material coated thereon, the hydrophobic material can be coated on the upper surface of the second bank 202, whereby the hydrophobic treatment may be performed on only the upper surface of the second bank 202.

Figure 5E:
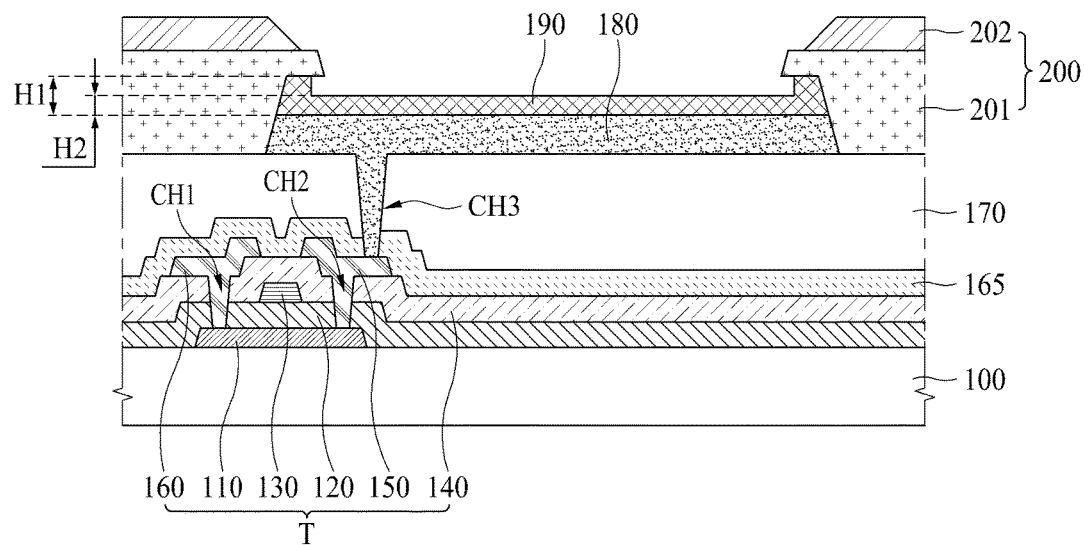

Subsequently, as shown in FIG. 5E, a portion of the auxiliary electrode 190 can be etched by using each of the first and second banks 201 and 202 as a mask. As described above, when the auxiliary electrode 190 is formed of ITO, only IZO can be selectively etched, and in this situation, an etchant including KOH, $H_2O_2$, and acid which do not damage the anode electrode 180 including ITO, the first bank 202 including an inorganic material, and the second bank 202 including an organic material can be used. However, the present embodiment is not limited thereto, and thus, the etchant can be used based on a material of the auxiliary electrode 190.

In detail, as illustrated in FIG. 5D, the organic material can remain as a residual layer or a foreign material 200a in an opening area of the auxiliary electrode exposed by the second bank 202 in a process of patterning the second bank 202 including the organic material.

In the related art, surface treatment technology using plasma or EUV is used for removing the foreign material 200a, but a hydrophobic area of the upper surface of the second bank 202 for which the hydrophobic treatment has been performed is removed together. Therefore, in an embodiment of the present disclosure, although the portion of the auxiliary electrode 190 is etched, the upper surface of the auxiliary electrode 190 and the foreign material 200a are simultaneously removed in the etching process, and thus, the auxiliary electrode including a planar and clean upper surface is obtained.

Particularly, as described above, in an embodiment of the present disclosure, the auxiliary electrode 190 can be formed of a material having a refractive index which is higher than that of the anode electrode 180, and in this situation, since the auxiliary electrode 190 is formed on the anode electrode 180, a refractive index difference between boundary surfaces through which light emitted from the organic light emitting layer 210 passes increases, thereby enhancing a light emission of the organic light emitting display device. That is, a whole portion of the auxiliary electrode 190 can be removed in a process of etching the auxiliary electrode 190 for removing the foreign material 200a, but in an embodiment of the present disclosure, the auxiliary electrode 190 can be provided on the anode electrode 180 in an opening area exposed by the first and second banks 201 and 202 without removing the whole portion of the auxiliary electrode 190, thereby enhancing light efficiency.

Figure 5F:
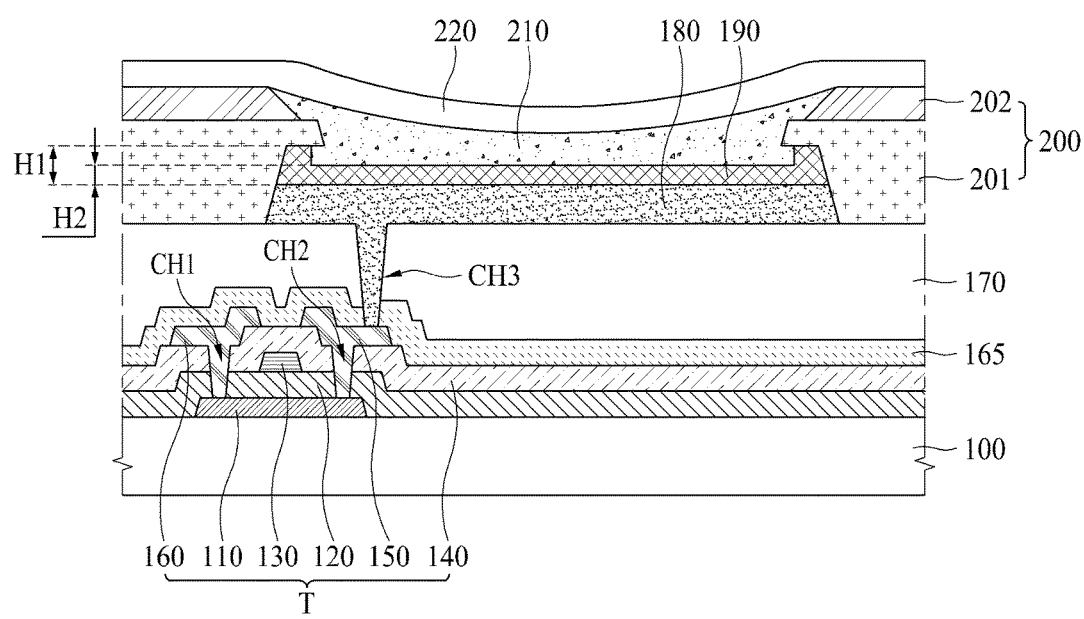

Subsequently, as shown in FIG. 5F, the organic light emitting layer 210 and a cathode electrode 220 can be sequentially formed on the auxiliary electrode 190. The organic light emitting layer 210 can be formed by spraying a soluble organic light emitting material through the inkjet printing process, and as described above, a whole portion or the upper surface of the second bank 202 can be formed of a hydrophobic material. Accordingly, the organic light emitting layer 210 can be deposited up to the upper surface of the auxiliary electrode 190, an upper surface of the first bank 201 exposed by the second bank 202, and a side surface of the second bank 202, but is not deposited on the upper surface of the second bank 202.

That is, in an embodiment of the present disclosure, the second bank 202 may be wholly formed of a hydrophobic material, or only the upper surface of the second bank 202 may be formed of a hydrophobic material, thereby preventing the organic light emitting layer 210 from being distributed to an emissive area of another pixel other than the upper surface of the second bank 202.

As described above, according to the embodiments of the present disclosure, a foreign material or a residual layer including an organic material which remains after forming the organic bank can be removed through a process of etching the auxiliary electrode, and thus, a clean auxiliary electrode is secured.

Moreover, according to the embodiments of the present disclosure, the hydrophobic area of the upper surface of the organic bank is not damaged in a process of removing a foreign material or a residual layer including an organic material, and thus, a unique function of the organic bank for restricting an area where the organic light emitting layer is provided is realized.

Moreover, according to the embodiments of the present disclosure, the auxiliary electrode having a refractive index relatively greater than that of the organic light emitting layer can be provided on the anode electrode, thereby enhancing an efficiency of light emitted from the organic light emitting layer.

Moreover, according to the embodiments of the present disclosure, the anode electrode and the auxiliary electrode can be respectively formed of transparent electrodes including similar materials, and thus, can be simultaneously etched by using the same etchant, thereby simplifying a manufacturing process.

Moreover, according to the embodiments of the present disclosure, the auxiliary electrode can be formed of a material easy to etch, thereby minimizing the damage of the organic bank.

Moreover, according to the embodiments of the present disclosure, since the second bank provided in the upper portion of the bank having a stepped structure includes a hydrophobic material and the first bank provided in the lower portion of the bank includes a hydrophilic material, the organic light emitting layer can be planarly provided on the upper surface of the auxiliary electrode, thereby realizing uniform luminance.

Moreover, according to the embodiments of the present disclosure, the side surface of the second bank which is provided to expose the edge of the first bank can be inclined with respect to the surface of the substrate, and thus, the organic light emitting layer can be more planarly provided on the upper surface of the auxiliary electrode, thereby realizing uniform luminance.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display device comprising:
   an anode electrode disposed on a substrate;
   an auxiliary electrode disposed on the anode electrode, the auxiliary electrode having a first height and a second height being different from the first height;
   a bank disposed on one side of the auxiliary electrode and another side of the auxiliary electrode;
   an organic light emitting layer disposed on an upper surface of the auxiliary electrode in an opening area exposed by the bank; and
   a cathode electrode disposed on the organic light emitting layer,
   wherein the auxiliary electrode has the first height in a covered area overlapping with the bank and the second height in the opening area exposed by the bank.

2. The organic light emitting display device of claim 1, wherein the auxiliary electrode is disposed between the anode electrode and the organic light emitting layer, and
   wherein a bottom surface of the auxiliary electrode directly contacts an upper surface of the anode electrode and an upper surface of the auxiliary electrode directly contacts a bottom surface of the organic light emitting layer.

3. The organic light emitting display device of claim 1, wherein the auxiliary electrode, the anode electrode and cathode electrode overlap each other, and
   wherein the auxiliary electrode overlaps with a center of a pixel including the anode and cathode electrodes.

4. The organic light emitting display device of claim 1, wherein an outer edge of the auxiliary electrode overlapping with and contacting the bank and has the first height, and
   wherein an area of the auxiliary electrode overlapping with and contacting the organic light emitting layer has the second height.

5. The organic light emitting display device of claim 1, wherein the auxiliary electrode comprises a material having a refractive index which is higher than a refractive index of the anode electrode.

6. The organic light emitting display device of claim 1, wherein the anode electrode comprises indium tin oxide (ITO), and the auxiliary electrode comprises indium zinc oxide (IZO).

7. The organic light emitting display device of claim 1, wherein the first height of the auxiliary electrode is greater than the second height of the auxiliary electrode.

8. The organic light emitting display device of claim 1, wherein a center of the auxiliary electrode is aligned with a center of the anode electrode.

9. The organic light emitting display device of claim 1, wherein an upper surface of the bank comprises a hydrophobic material.

10. The organic light emitting display device of claim 1, wherein the bank comprises:
    a first bank disposed on one side of the anode electrode and another side of the anode electrode and overlapping with an outer edge of the auxiliary electrode; and
    a second bank disposed on the first bank and exposing an inner edge of the first bank, and
    wherein the organic light emitting layer is disposed on an upper surface of the auxiliary electrode exposed by the first bank and the organic light emitting layer is disposed on an exposed upper surface of the first bank exposed by the second bank.

11. The organic light emitting display device of claim 10, wherein the second bank includes an inclined inner edge disposed between the exposed upper surface of the first bank and an upper surface of the second bank.

12. The organic light emitting display device of claim 1, wherein the bank comprises:
    a first bank disposed on one side of the anode electrode and another side of the anode electrode and overlapping with an outer edge of the auxiliary electrode; and
    a second bank disposed on the first bank and exposing an inner edge of the first bank,
    wherein the organic light emitting layer is disposed on an upper surface of the auxiliary electrode exposed by the first bank and the organic light emitting layer is disposed on an exposed upper surface of the first bank exposed by the second bank.

13. The organic light emitting display device of claim 12, wherein the first bank comprises a hydrophilic material, and at least one upper area of the second bank comprises a hydrophobic material.

14. The organic light emitting display device of claim 12, wherein the first bank comprises a hydrophilic material, and the second bank comprises a hydrophobic material.

15. The organic light emitting display device of claim 12, wherein the second bank includes an inclined inner edge disposed between the exposed upper surface of the first bank and an upper surface of the second bank.

16. The organic light emitting display device of claim 15, wherein the second bank is thicker than an overhang portion of the first bank disposed between the outer edge of the auxiliary electrode and the inclined inner edge of the second bank.

17. The organic light emitting display device of claim 15, wherein an angle between the inclined inner edge of the second bank and an upper surface of the first bank is 45 degrees or less.

18. An organic light emitting display device comprising:
    an anode electrode disposed on a substrate;

a bank disposed on one side of the anode electrode and another side of the anode electrode;

an organic light emitting layer disposed on the anode electrode;

a cathode electrode disposed on the organic light emitting layer;

an auxiliary electrode disposed between the anode electrode and the cathode electrode, the auxiliary electrode having a first height and a second height being less than the first height;

wherein the auxiliary electrode overlaps with a center of a pixel including the anode and cathode electrodes, and wherein an upper surface of the auxiliary electrode contacts the organic light emitting layer and a lower surface of the auxiliary electrode contacts the anode electrode.

19. The organic light emitting display device of claim 18, wherein the auxiliary electrode and the anode electrode have approximately the same area, and wherein the auxiliary electrode and the anode electrode have approximately the same planar shape.

20. The organic light emitting display device of claim 18, wherein outer edges of the auxiliary electrode are thicker than a center portion of the auxiliary electrode.

* * * * *